(12) United States Patent
Li et al.

(10) Patent No.: US 7,443,679 B2
(45) Date of Patent: Oct. 28, 2008

(54) HEAT DISSIPATING DEVICE HAVING A FIN ALSO FUNCTIONING AS A FAN HOLDER

(75) Inventors: Wei Li, Shenzhen (CN); Yi-Qiang Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/621,085

(22) Filed: Jan. 8, 2007

(65) Prior Publication Data

US 2008/0144286 A1    Jun. 19, 2008

(51) Int. Cl.
*H05K 7/20* (2006.01)
*F28F 7/00* (2006.01)
*F28D 15/00* (2006.01)

(52) U.S. Cl. .................... 361/704; 361/695; 361/697; 361/700; 165/80.3; 165/104.33; 165/185

(58) Field of Classification Search ................. 361/695, 361/697, 699–704, 709–710, 719; 165/80.3–80.5, 165/104.33; 174/15.2, 16.3
See application file for complete search history.

(56) References Cited

U.S. PATENT DOCUMENTS

| | | | | |
|---|---|---|---|---|
| 6,269,864 | B1 * | 8/2001 | Kabadi | 165/80.3 |
| 6,370,774 | B1 * | 4/2002 | Sheu | 29/890.03 |
| 6,390,188 | B1 * | 5/2002 | Chen | 165/185 |
| 6,665,934 | B2 * | 12/2003 | Lo | 29/890.03 |
| 6,788,536 | B2 | 9/2004 | Lai et al. | |
| 6,938,682 | B2 * | 9/2005 | Chen et al. | 165/104.33 |
| 6,945,319 | B1 * | 9/2005 | Li et al. | 165/104.33 |
| 7,004,236 | B2 | 2/2006 | Lee et al. | |
| 7,174,951 | B1 * | 2/2007 | Lin | 165/104.33 |
| 7,215,548 | B1 * | 5/2007 | Wu et al. | 361/703 |
| 7,245,494 | B2 * | 7/2007 | Cheng | 361/700 |
| 7,269,012 | B2 * | 9/2007 | Lee et al. | 361/701 |
| 7,277,287 | B2 * | 10/2007 | Chen et al. | 361/700 |
| 7,286,353 | B2 * | 10/2007 | Yu et al. | 361/697 |
| 2005/0087329 | A1 * | 4/2005 | Zhang et al. | 165/104.33 |
| 2005/0099774 | A1 * | 5/2005 | Song | 361/700 |
| 2006/0028798 | A1 * | 2/2006 | Wang | 361/697 |
| 2006/0120044 | A1 * | 6/2006 | Yu et al. | 361/695 |
| 2006/0137861 | A1 * | 6/2006 | Wang et al. | 165/104.33 |
| 2006/0175045 | A1 * | 8/2006 | Chen | 165/104.33 |
| 2007/0119566 | A1 * | 5/2007 | Peng | 165/80.3 |
| 2007/0215328 | A1 * | 9/2007 | Hsu et al. | 165/104.33 |
| 2008/0121372 | A1 * | 5/2008 | Zhou et al. | 165/80.3 |
| 2008/0128111 | A1 * | 6/2008 | Zhou et al. | 165/80.3 |
| 2008/0135215 | A1 * | 6/2008 | Wu | 165/104.33 |

* cited by examiner

*Primary Examiner*—Jayprakash N Gandhi
*Assistant Examiner*—Robert J Hoffberg
(74) *Attorney, Agent, or Firm*—Frank R. Niranjan

(57) ABSTRACT

A heat dissipating device for cooling a heat-generating electronic device, includes a heat sink assembly (10) and a fan (20) mounted to a side of the heat sink assembly. The heat sink assembly includes a heat spreader (12), a plurality of fins (14), and heat pipes (16) thermally connecting the heat spreader and the fins. The fins include at least one fastening fin (146). The fastening fin includes a pair of mounting tabs (1462). The mounting tabs of the fastening fin are oriented towards the fan for mounting the fan on the heat sink assembly. The fastening fin functions not only for dissipating heat into a surrounding environment but also for connecting the fan to the heat sink assembly.

4 Claims, 5 Drawing Sheets

HEAT DISSIPATING DEVICE HAVING A FIN ALSO FUNCTIONING AS A FAN HOLDER

BACKGROUND OF THE INVENTION

1. Field of the Invention

The present invention relates to a heat dissipating device having a plurality of fins, wherein at least one fin functions as a fan holder to mount a fan on a heat sink of the heat dissipating device.

2. Description of Related Art

With the progress of technology electronic products are becoming lighter, thinner, shorter, and smaller. Therefore, the free space inside electronic products is becoming more and more limited.

In electronic products having broad applications, a heat dissipation device is commonly used in all kinds of industrial equipment. The conventional heat dissipation device commonly comprises a heat sink and a fan mounted to the heat sink. A fan holder or a fan fastener is used for connecting the fan and the heat sink to mount the fan onto the heat sink. U.S. Pat. No. 6,788,536 and U.S. Pat. No. 7,004,236 show examples of this kind of heat dissipation device. However, extra fan holders or fan fasteners not only waste space and raise cost, but also make the installation and maintenance of the fans troublesome.

Thus, it is desired to devise a heat dissipating device which can directly mount a fan thereon.

SUMMARY OF THE INVENTION

According to a preferred embodiment of the present invention, a heat dissipating device for cooling a heat-generating electronic device, includes a heat sink assembly and a fan mounted to a side of the heat sink assembly. The heat sink assembly includes a heat spreader, a plurality of fins, and heat pipes thermally connecting the heat spreader and the fins. The fins include at least one fastening fin. The fastening fin includes a pair of mounting tabs. The mounting tabs of the fastening fin are oriented towards the fan for mounting the fan on the heat sink assembly.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
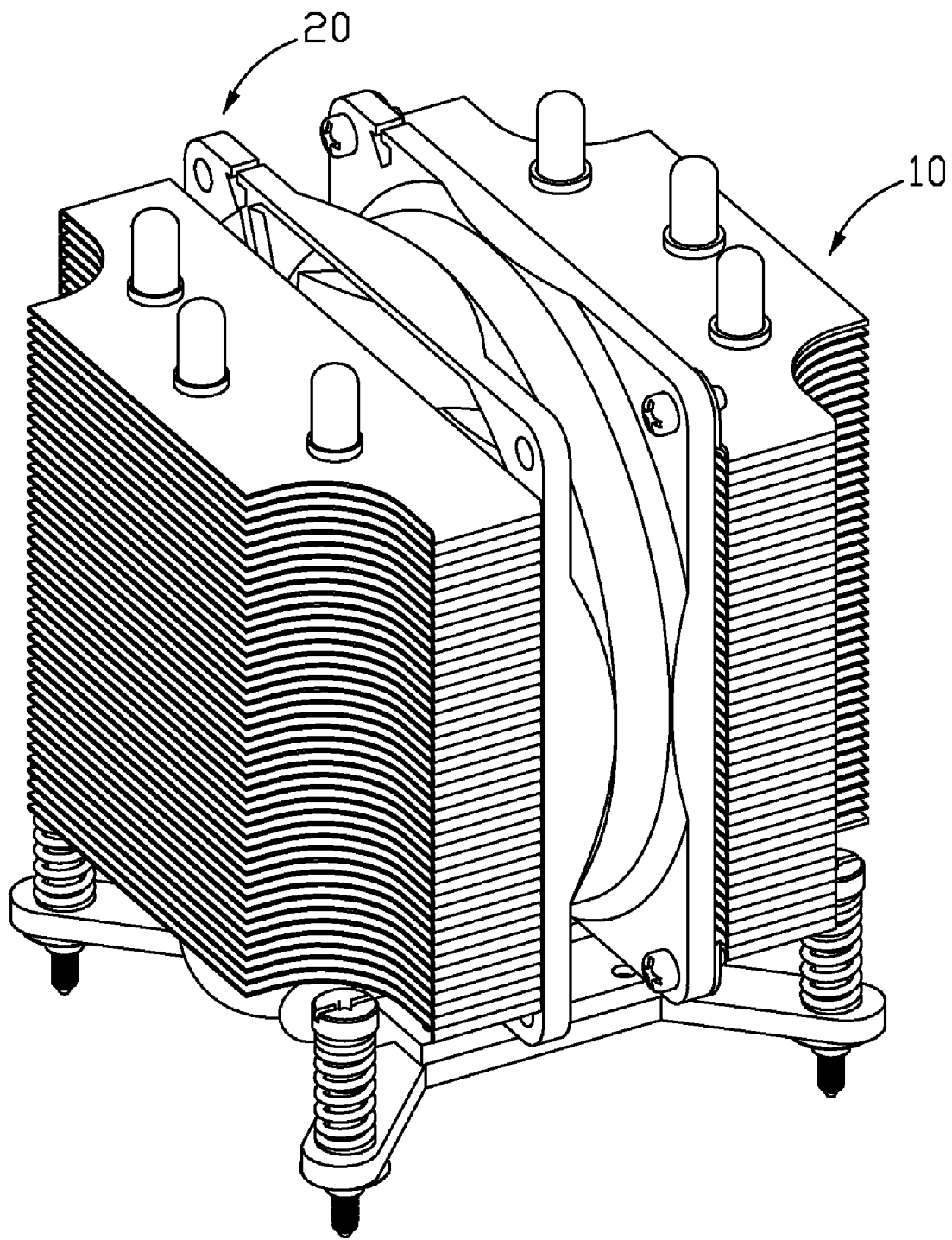
FIG. 1 is an assembled view of a heat dissipating device in accordance with a preferred embodiment of the present invention.

FIG. 1 shows a heat dissipating device in accordance with a preferred embodiment of the present invention. The heat dissipating device is to be mounted on a printed circuit board (not shown) and comprises a heat sink assembly 10 and a fan 20 mounted to the heat sink assembly 10.

Figure 2:
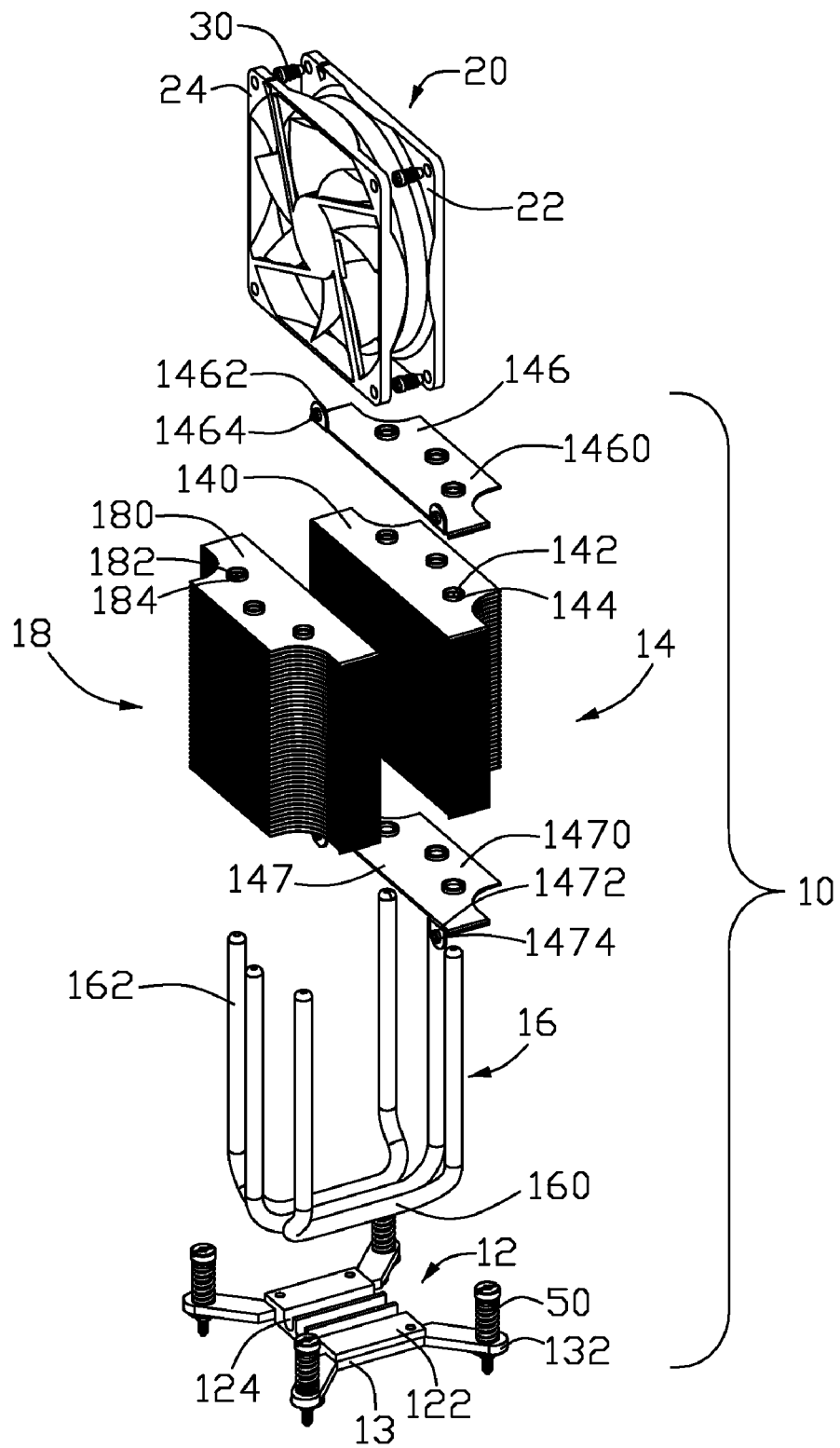
FIG. 2 is an exploded view of the heat dissipating device of FIG. 1.

Also referring to FIG. 2, the heat sink assembly 10 comprises a heat spreader 12, a first fin assembly 14 and a second fin assembly 18, with three parallel U-shaped heat pipes 16 thermally connecting the heat spreader 12 and the first and second fin assemblies 14, 18.

The heat spreader 12 has a bottom face (not labeled) for contacting a CPU (not shown) mounted on the printed circuit board to absorb heat therefrom, and a top face 122 with three grooves 124. Two mounting brackets 13 each with a pair of ears 132 are attached to opposite bottom sides of the heat spreader 12. The heat spreader 12 thermally engages with the CPU mounted on the printed circuit board by extending four fasteners 50 through the four ears 132 to threadedly engage with a retainer (not shown) attached to a bottom side of the printed circuit board.

Each heat pipe 16 comprises a horizontal evaporating portion 160 and a pair of vertical condensing portions 162 parallel to each other. The condensing portions 162 extend from two opposite ends of the evaporating portion 160. The evaporating portions 160 of the heat pipes 16 are soldered in the grooves 124 of the heat spreader 12. The condensing portions 162 are extended through the first and second fin assemblies 14, 18.

The first fin assembly 14 comprises a plurality of first fins (not labeled) each having a first flat body 140. The second fin assembly 18 comprises a plurality of second fins (not labeled) each having a second flat body 180. The bodies 140, 180 of the first and second fins are parallel to the heat spreader 12. The bodies 140, 180 of the first and second fins are perforated with through holes 142, 182. Each of the through holes 142, 182 has its respective annular sidewall 144, 184 that is formed during punching of its respective through hole 142, 182. The condensing portions 162 of the heat pipes 16 are received in the through holes 142, 182 and soldered to the sidewalls 144, 184 so that the first fin assembly 14 and the second fin assembly 18 are combined with the condensing portions 162 of the heat pipe 16. The first and second fin assemblies 14, 18 are both mounted on the evaporating portions 160 of the heat pipes 16. The first fin assembly 14 has a top fin 146 and a bottom fin 147. The top and bottom fins 146, 147 cooperatively function as a fan holder for mounting the fan 20 on a side of the first fin assembly 14, in addition to their original function of heat dissipation. In this preferred embodiment of the present invention, the fan 20 is sandwiched between the first fin assembly 14 and the second fin assembly 18. The top fin 146 and the bottom fin 147 have the same configuration and are mounted on top and bottom of the first fin assembly 14. The top fin 146 has a body 1460 with a configuration similar to that of each of the bodies 140 of the first fins and a pair of tabs 1462 extending upwardly from a front edge of the body 1460. The bottom fin 147 also has a body 1470 with a configuration similar to that of each of the bodies 140 of the first fins and a pair of tabs 1472 extending downwardly from a front edge of the body 1470. The tabs 1462, 1472 are located at opposite ends of the edges of the bodies 1460, 1470 and oriented towards the fan 20. The tabs 1462, 1472 correspond to four corners of the fan 20 and define threaded holes 1464, 1474 therein.

The fan 20 has a square configuration and comprises a pair of parallel plates 22, 24. The plate 22 is oriented to the first fin assembly 14, and the plate 24 is oriented towards the second fin assembly 18. The fan 20 is inserted between the first and second fin assemblies 14, 18 after the heat sink assembly 10 is assembled together. Four screws 30 are extended through four corners of the plate 22 and threadedly engaged in the threaded holes 1464, 1474 of the tabs 1462, 1472 of the top and bottom fins 146, 147 of the first fin assembly 14, thus attaching the fan 20 on the first fin assembly 14.

When the fan 20 operates, airflow generated by the fan 20 flows through the first, second fin assemblies 14, 18 to take heat away therefrom. The first and second fin assemblies 14, 18 absorb the heat from the CPU. Accordingly, the heat generated by the CPU can be quickly dissipated.

Figure 3:
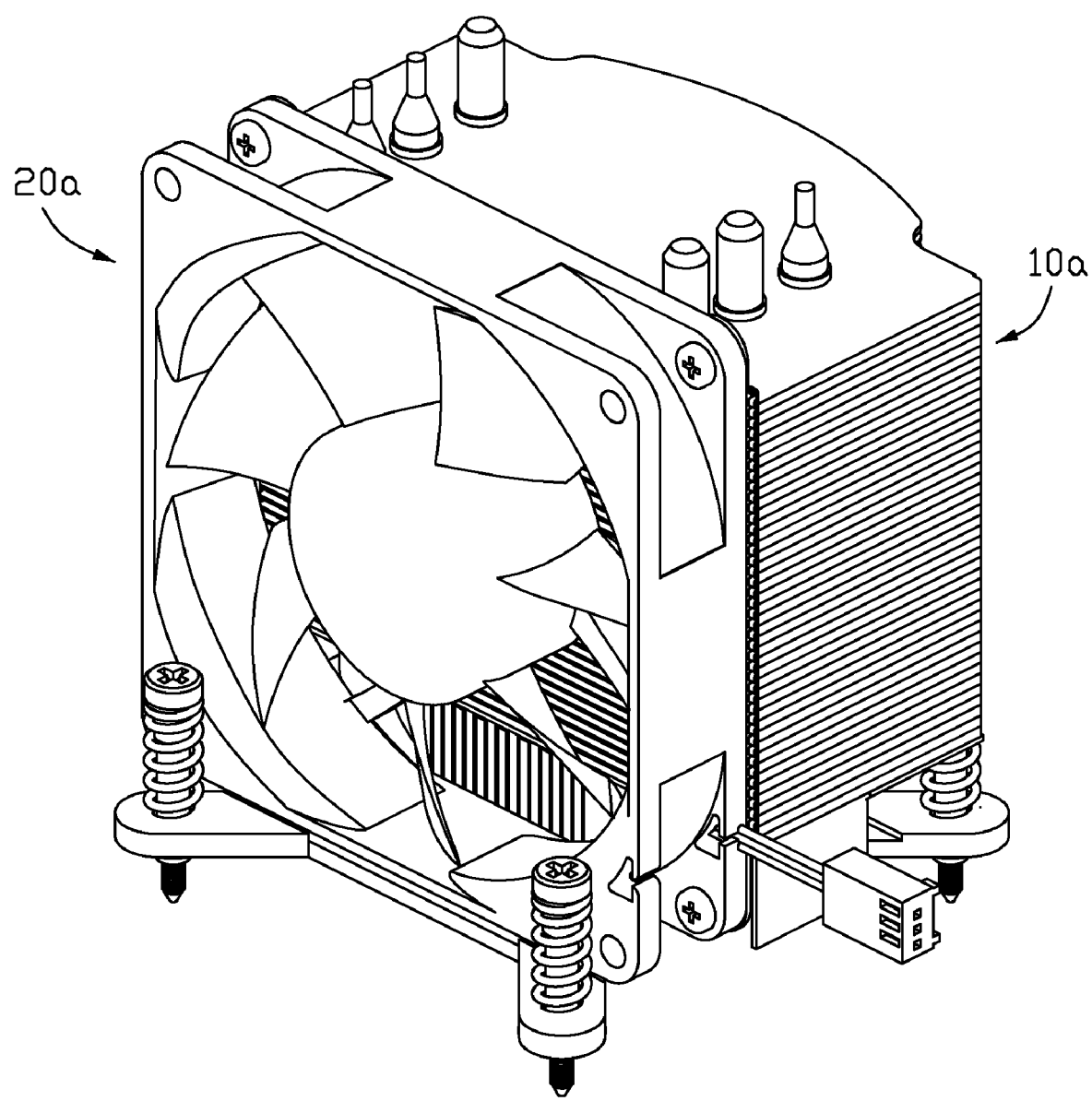
FIG. 3 is an assembled view of a heat dissipating device in accordance with a second embodiment of the present invention.
Figure 4:
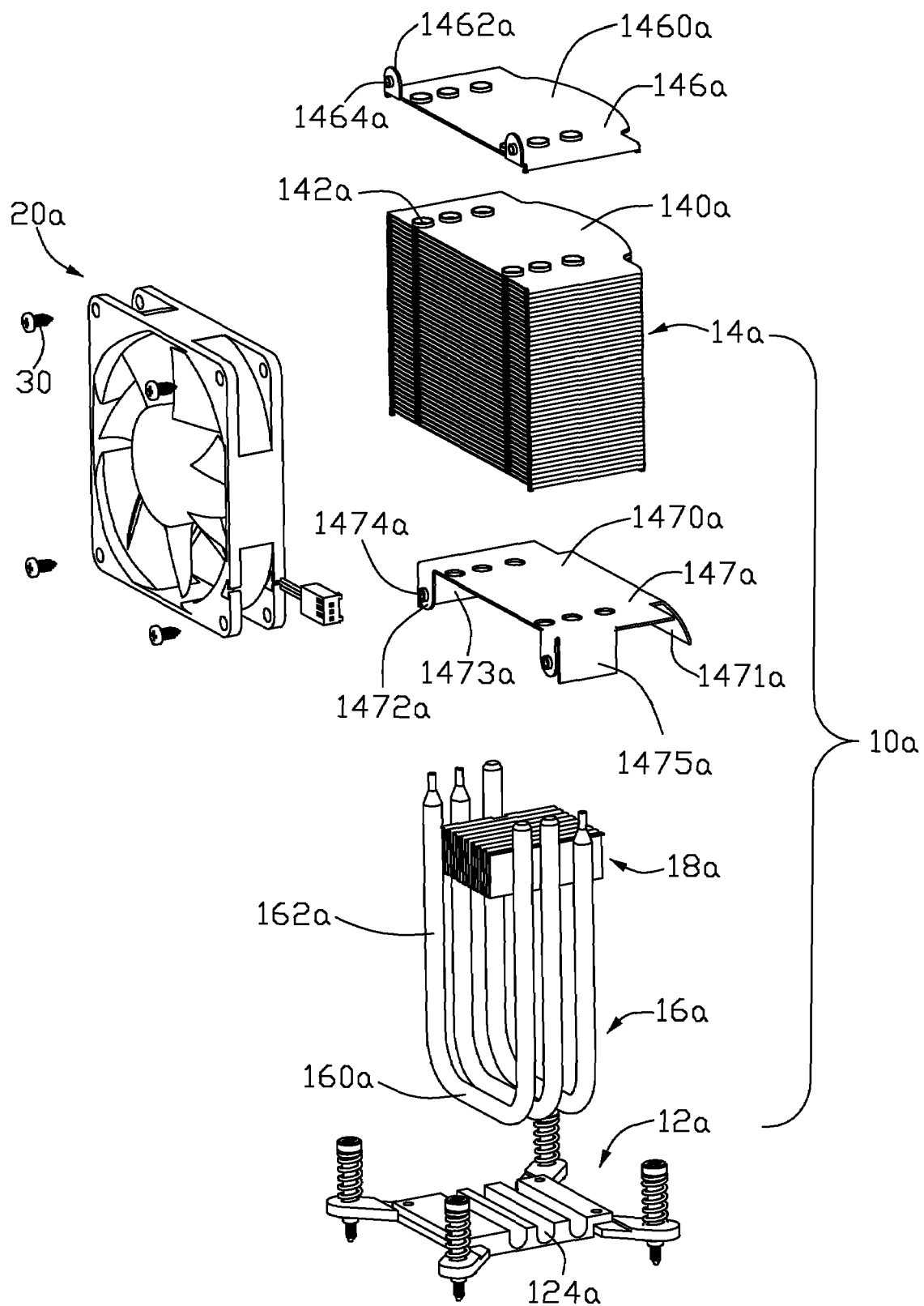
FIG. 4 is an exploded view of the heat dissipating device of FIG. 3.

Referring to FIGS. 3-4, a heat dissipation device according to a second embodiment of the present invention is shown. The heat dissipation device in the second embodiment comprises a heat sink assembly 10a and a fan 20a mounted on the heat sink assembly 10a.

The heat sink assembly 10a comprises a heat spreader 12a, a first fin assembly 14a, a second fin assembly 18a mounted below the first fin assembly 14a, three parallel U-shaped heat pipes 16a thermally connecting the heat spreader 12a and the first and second fin assemblies 14a, 18a. The heat spreader 12a has the same configuration as the heat spreader 12 of the first preferred embodiment of the present invention and defines three parallel grooves 124a therein. Each heat pipe 16a comprises a horizontal evaporating portion 160a soldered into a corresponding groove 124a of the heat spreader 12a and a pair of vertical condensing portions 162a perpendicularly extending from two opposite ends of the evaporating portion 160a.

Figure 5:
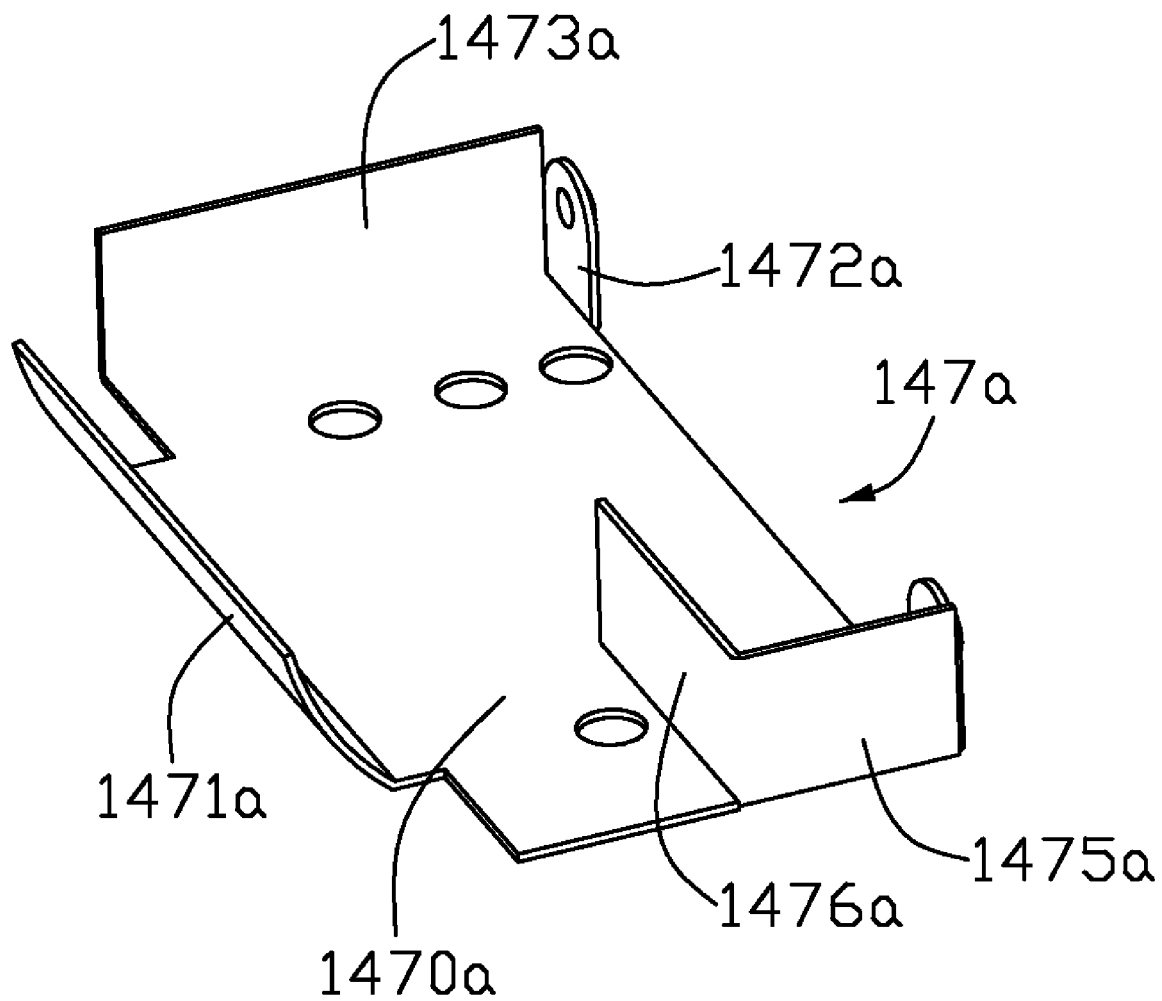
FIG. 5 is an enlarged isometric view of a bottom fin of the heat dissipating device of FIG. 4 from a different aspect.

The first fin assembly 14a comprises a plurality of first fins (not labeled) each having a first flat body 140a parallel to the heat spreader 12a. Each first flat body 140a is perforated with through holes 142a. The condensing portions 162a of the heat pipes 16a are soldered in the through holes 142a so that the first fins are combined with the heat pipes 16a. The second fin assembly 18a is located between the condensing portions 162a of the heat pipes 16a. The first fin assembly 14a has a top fin 146a and a bottom fin 147a. The top and bottom fins 146a, 147a cooperatively function as a fan holder to mount the fan 20a on a front side of the first fin assembly 14a, in addition to their original function of heat dissipation. The top fin 146a has a body 1460a with a configuration similar to that of each of the bodies 140a of the first fins and a pair of tabs 1462a extending upwardly from an edge of the body 1460a. The bottom fin 147a also has a body 1470a with a configuration similar to that of each of the bodies 140a of the first fins and a pair of tabs 1472a extending downwardly from an edge of the body 1470a. The tabs 1462a, 1472a are located on opposite ends of the edge of the bodies 1460a, 1470a and are oriented towards the fan 20a. The tabs 1462a, 1472a correspond to four corners of the fan 20a; each tab 1462a, 1472a defines a threaded hole 1464a, 1474a therein. An inclined guiding plate 1471a is bent downwardly from a rear end of the body 1470a, whereby a portion of the airflow generated by the fan 20a flows through the second fin assembly 18a and then is guided by the guiding plate 1471a to directly blow over other electronic components at a rear side of the CPU. A first and second opposite baffle walls 1473a, 1475a extend perpendicularly downwardly from two lateral sides of the body 1470a of the bottom fin 147a, respectively. Referring also to FIG. 5, the second baffle wall 1475a has a length shorter than that of the first baffle wall 1473a. A separator plate 1476a is perpendicularly bent from a rear end of the second baffle wall 1475a toward the first baffle wall 1473a.

The second fin assembly 18a is formed by continuously bending a single metal plate. A bottom of the second fins 18a is soldered on the evaporating portions 160a of the heat pipes 16a, and a top of the second fin assembly 18a is soldered to a bottom of the bottom fin 147a of the first fin assembly 14a in a manner such that the heat spreader 12a, the evaporating portions 160a of the heat pipes 16a, and the first and second fin assemblies 14a, 18a are thermally connected together, whereby the heat received by the evaporating portions 160a is immediately transferred to the first and second fins of the first and second fin assemblies 14a, 18a. A free end of the separator plate 1476a abuts against a corresponding lateral side of the second fin assembly 18 and a bottom edge of the separator plate 1476a intimately contacts with a top surface of the heat spreader 12a, thus preventing a portion of the airflow generated by the fan 20a from flowing through a gap between the second baffle wall 1475a and the lateral side of the second fin assembly 18a along the front-to-rear direction.

In assembly of the second embodiment of the present invention, the fan 20a is mounted to the front side of the first fin assembly 14a by bringing screws 30 to extend through the corners of the fan 20a and screw into the threaded holes 1464a, 1474a of the top and bottom fins 146a, 147a of the first fin assembly 14a. Thus, the fan 20a and the heat sink assembly 10a are connected together.

In the present invention, by the provision of the tabs formed on the fins, the fan can be firmly mounted to the side of the heat sink assembly without any fan holders. Thus, cost of the heat dissipation device is decreased.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating device comprising:
    a heat spreader for contacting with a heat-generating electronic device;
    a set of fins mounted on and thermally connecting with the heat spreader for dissipating heat from the heat spreader, said fins comprising a plurality of first fins each having a first body and a fastening fin positioned at a bottom of the fins and having a second body and a pair of tabs extending perpendicularly and downwardly from an edge of the second body of the fastening fin;
    a U-shaped heat pipe having a horizontal evaporating portion mounted on the heat spreader, and a pair of vertical parallel condensing portions extending from two opposite ends of the evaporating portion into the set of fins;
    a plurality of additional fins mounted on the evaporating portion of the heat pipe and sandwiched between the condensing portions of the heat pipe and below the set of fins, and the condensing portions of the heat pipe extending through the fins; and
    a fan mounted to a side of the fins;
    wherein the tabs of the fastening fin are oriented to the fan for engaging with the fan to mount the fan on the fins, and wherein the first body has a configuration similar to that of the second body; and wherein a first and a second opposite baffle walls extend perpendicularly from two lateral sides of the second body, respectively.

2. The heat dissipating device of claim 1, wherein the second baffle wall has a length shorter than that of the first baffle wall.

3. The heat dissipating device of claim 2, wherein a separator plate is bent from a rear end of the second baffle wall toward the first baffle wall.

4. The heat dissipating device of claim 1, wherein the fan is secured to the tabs by fasteners engaging with the tabs and the fan.

* * * * *